United States Patent
Boyd, Jr. et al.

(10) Patent No.: US 10,460,916 B2
(45) Date of Patent: Oct. 29, 2019

(54) REAL TIME MONITORING WITH CLOSED LOOP CHUCKING FORCE CONTROL

(71) Applicant: Applied Materials, Inc., Santa Clara, CA (US)

(72) Inventors: Wendell Glenn Boyd, Jr., Morgan Hill, CA (US); Vijay D. Parkhe, San Jose, CA (US); Matthew James Busche, Santa Clara, CA (US); Konstantin Makhratchev, Fremont, CA (US); Masanori Ono, Chiba (JP); Senh Thach, Union City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/979,787

(22) Filed: May 15, 2018

(65) Prior Publication Data

US 2018/0330926 A1 Nov. 15, 2018

Related U.S. Application Data

(60) Provisional application No. 62/506,313, filed on May 15, 2017.

(51) Int. Cl.
| | |
|---|---|
| *H05B 33/00* | (2006.01) |
| *H01J 37/32* | (2006.01) |
| *H01L 21/683* | (2006.01) |
| *H01L 21/66* | (2006.01) |
| *H01L 21/67* | (2006.01) |
| *H01L 21/687* | (2006.01) |

(52) U.S. Cl.
CPC .. *H01J 37/32697* (2013.01); *H01L 21/67248* (2013.01); *H01L 21/67253* (2013.01); *H01L 21/67259* (2013.01); *H01L 21/6831* (2013.01); *H01L 21/6833* (2013.01); *H01L 22/20* (2013.01); *H01J 37/32724* (2013.01); *H01J 2237/002* (2013.01); *H01J 2237/2007* (2013.01); *H01J 2237/24585* (2013.01); *H01J 2237/332* (2013.01); *H01J 2237/334* (2013.01); *H01L 21/67069* (2013.01); *H01L 21/68742* (2013.01)

(58) Field of Classification Search
CPC .......... H01L 21/6831; H01L 21/67126; H01L 21/67253; H01L 21/6833; H01L 21/68735; H01L 21/68771; H02N 13/00
See application file for complete search history.

(56) References Cited

U.S. PATENT DOCUMENTS

2017/0076915 A1 3/2017 Boyd, Jr. et al.

*Primary Examiner* — Monica C King
(74) *Attorney, Agent, or Firm* — Patterson + Sheridan LLP

(57) ABSTRACT

Embodiments disclosed herein include a method for minimizing chucking forces on a workpiece disposed on a electrostatic chuck within a plasma processing chamber. The method begins by placing a workpiece on an electrostatic chuck in a processing chamber. A plasma is struck within the processing chamber. A deflection force is monitored on the workpiece. A chucking voltage is applied at a minimum value. A backside gas pressure is applied at a minimum pressure. The chucking voltage and or backside gas pressure is adjusted such that the deflection force is less than a threshold value. And the chucking voltage and the backside gas pressure are simultaneously ramped up.

11 Claims, 7 Drawing Sheets

REAL TIME MONITORING WITH CLOSED LOOP CHUCKING FORCE CONTROL

CROSS-REFERENCE TO RELATED APPLICATIONS

This application claims benefit of U.S. Provisional Application Ser. No. 62/506,313, filed May 15, 2017, of which is incorporated by reference in its entirety.

BACKGROUND

Field

Embodiments of the present invention generally relate to substrate supports used in processing chambers for fabricating microelectronic devices.

Description of the Related Art

In high precision manufacturing, for example semiconductor manufacturing, a workpiece may need to be precisely held by a fixture during manufacturing operations to increase uniform quality and reduce defects. In some manufacturing operations a substrate support may be used as the fixture to hold the workpiece against a supporting structure. An electrostatic force or other force ("clamping force") often is used to precisely hold the workpiece to a workpiece support surface of the substrate support during one or more manufacturing operations. These types of substrate supports are called electrostatic chucks (ESC).

The workpieces should be held with as minimal clamping force as possible with the lowest possible contact to the workpiece support surface to reduce defects during these manufacturing operations. However, because of manufacturing variances such as surface treatments applied to workpieces that can alter the chucking force, wear and contamination of the substrate support's support surface, and because of other environmental effects, manufacturing personnel often find themselves increasing the target clamping force to provide a factor of safety to ensure that a sufficient clamping force is being applied to counter the aforementioned variances and effect of those variances on the chucking forces.

A large majority of the substrate supports used in semiconductor manufacturing industry often apply clamping forces that are greater than necessary, i.e., over-chucking. Over-chucking causes damage to the workpiece, for example, by causing craters in a backside of the workpiece, embedding parts of the substrate support into the workpiece, increasing film stress in the workpiece, and/or causing particulates which may cause quality problems on the processing side of the workpiece. For example, for high volume production runs, the average total front side defects fluctuated between about three to four 25 nm or greater sized particles per wafer. Analysis has shown that 80% to 90% of these defects are Si, Al, or O containing particles from the ESC. Particle test result of the workpiece backside show that one standard 1800V chucking/de-chucking cycle can generate between about 8000 to 24000 defects being 0.5 um or greater in size on the backside of the workpiece. Within these defects, about 35% are scratch marks, about 50% are embedded silicon particles generated from scratches; and about 15% are Si, Si—O, Al—Si—O loose particles from the ESC and/or the workpiece. Some of these loose defects can land on the surface of the workpiece from the workpiece lift up/drop down motion during chucking and de-chucking with a large chucking force.

As manufacturing tolerances become increasingly tighter and the need to reduce costs becomes more important, new approaches are needed which provide a more consistent and predictable clamping force for accommodating a wider range of manufacturing variances and reduce manufacturing defects discussed above.

Therefore, there is a need for an improved apparatus and method for supporting the workpiece during processing.

SUMMARY

Embodiments disclosed herein include a method for minimizing chucking forces on a workpiece disposed on a electrostatic chuck within a plasma processing chamber. The method begins by placing a workpiece on an electrostatic chuck in a processing chamber. A plasma is struck within the processing chamber. A deflection force is monitored on the workpiece. A chucking voltage is applied at a minimum value. A backside gas pressure is applied at a minimum pressure. The chucking voltage and or backside gas pressure is adjusted such that the deflection force is less than a threshold value. And the chucking voltage and the backside gas pressure are simultaneously ramped up.

BRIEF DESCRIPTION OF THE DRAWINGS

So that the manner in which the above recited features of embodiments of the present invention can be understood in detail, a more particular description of embodiments of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for embodiments of the invention may admit to other equally effective embodiments.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings and included to provide a further understanding, and are incorporated in and constitute a part of this specification. The drawings illustrate one or more embodiment(s), and together with the description serve to explain principles and operation of the various embodiments.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein; rather, these embodiments are provided so that this disclosure will satisfy applicable legal requirements. Whenever possible, like reference numbers will be used to refer to like components or parts.

Embodiments disclosed herein include a sensor assembly that includes one or more of a sensor housing and a deflection sensor. The sensor assembly is configured to be disposed within a substrate support assembly, such as an electrostatic chuck configured with backside gas, or other suitable assembly for holding a workpiece while processing in a processing chamber. For example, the sensor assembly may be disposed in an existing backside gas delivery hole or other hole in the electrostatic chuck. The deflection sensor may provide real-time measurements of the deflection in a workpiece for determining a balance of forces on the workpiece disposed on the electrostatic chuck. By using the deflection sensor to determine a chucking force, the workpiece chucking/de-chucking process may be optimize for minimizing the chucking force which reduces/eliminates backside workpiece defects and the particles generated therefrom. For example, by ramping up and ramping down the chucking voltage with the flow of the backside He pressure simultaneously during chucking/de-chucking, the process minimizes the chucking force suitable to hold the workpiece which minimizes backside workpiece scratches and particle generation therefrom.

Figure 1:
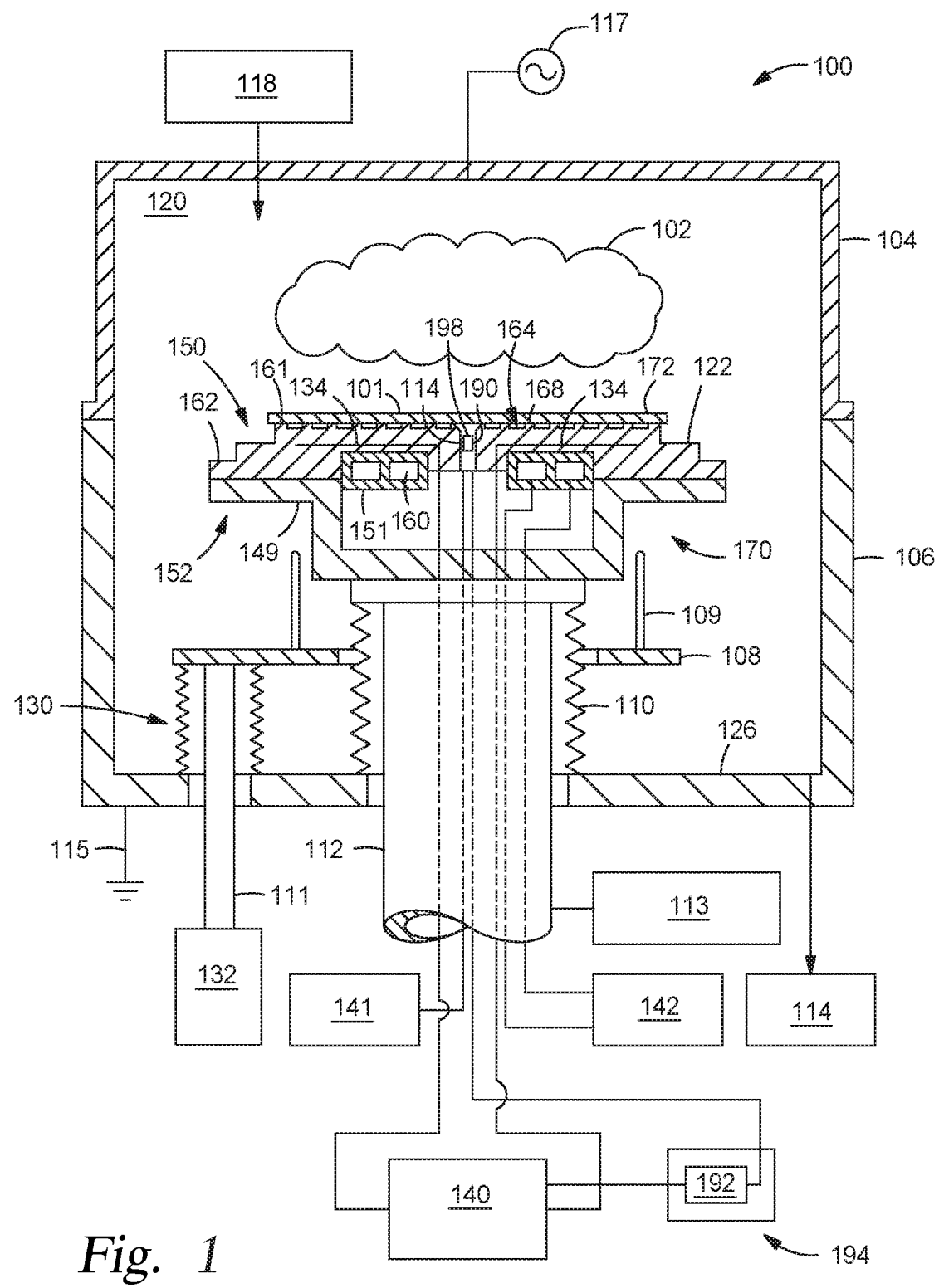
FIG. 1 is a schematic side view of an exemplary plasma processing chamber having a substrate support installed within.

FIG. 1 illustrates one embodiment of the sensor assembly 190. FIG. 1 depicts a schematic view of an exemplary plasma processing chamber 100 having a substrate support assembly 170 installed therein. The substrate support assembly 170 has a sensor assembly 190 disposed therein. In one embodiment, the plasma processing chamber 100 is a sputter etch processing chamber or a plasma etch system. However, other types of processing chambers, such as physical vapor deposition (i.e., sputtering) chambers, chemical vapor deposition chambers, etch chambers, selective removal process chambers (SRP), or other vacuum processing chambers, may also be used to practice the embodiments disclosed herein.

The plasma processing chamber 100 is a vacuum chamber which may be suitably adapted to maintain sub-atmospheric pressures within a chamber interior volume 120 during processing of a workpiece 101, such as a substrate, for example a silicon wafer. The plasma processing chamber 100 includes a chamber body 106 having a bottom surface 126 and is covered by a lid 104 which encloses the chamber interior volume 120. The chamber body 106 and the lid 104 may be made of a metal, such as aluminum or other suitable material.

The plasma processing chamber 100 is coupled to and in fluid communication with a vacuum system 114 which includes a throttle valve (not shown) and vacuum pump (not shown) which are used to pump down and exhaust the plasma processing chamber 100. The pressure inside the plasma processing chamber 100 may be regulated by adjusting the throttle valve and/or vacuum pump. The plasma processing chamber 100 is also coupled to and in fluid communication with a process gas supply 118 which may supply one or more process gases to the plasma processing chamber 100, such as argon, oxygen, chlorine, fluorine or other gas suitable for processing the workpiece 101.

An RF plasma power supply 117 may energize the process gases to maintain a plasma 102 for processing the workpiece 101. Optionally, the substrate support assembly 170 may bias the workpiece 101 to attract the ions from the plasma 102 thereto. Process gases, such as chlorine, are introduced into the plasma processing chamber 100 from a process gas supply 118 and the gas pressure is adjusted for plasma ignition. The plasma 102 is ignited in the chamber interior volume 120 through capacitive coupling when RF power is delivered. An RF match (not shown) may be adjusted or preset to improve the efficiency of power transfer from the RF plasma power supply 117 to the plasma 102.

The substrate support assembly 170 is disposed within the chamber interior volume 120. The substrate support assembly 170 has a workpiece support surface 172 upon which the workpiece 101 rests during processing. The substrate support assembly 170 may include a vacuum chuck, an electrostatic chuck, a susceptor, a heater, or other substrate support suitable for supporting the workpiece 101 within the plasma processing chamber 100 during processing.

In one embodiment, the substrate support assembly 170 includes an electrostatic chuck 122. The substrate support assembly 170 may additionally include a cooling plate 151, and a support base 152. The support base 152 may include a support housing 149, bellows assembly 110 and a support shaft 112. The support shaft 112 may be coupled to a lift mechanism 113 which may provide vertical movement of the substrate support assembly 170 between an upper, processing position, as shown, and a lower workpiece transfer position (not shown). The bellows assembly 110 may be disposed about the support shaft 112 and may be coupled between the support base 152 and the bottom surface 126 of the plasma processing chamber 100 to provide a flexible seal that allows vertical motion of the substrate support assembly 170 while preventing loss of vacuum from within the plasma processing chamber 100.

Temperature regulation of the workpiece 101 disposed on the substrate support assembly 170 may be facilitated by multiple cooling channels 160 which are disposed in the cooling plate 151. The cooling channels 160 are coupled to and in fluid communication with a fluid source 142 which provides a coolant fluid, such as water, although any suitable coolant fluid, gas or liquid, may be used.

The substrate support assembly 170 may include a substrate lift 130 for supporting the workpiece 101 spaced above the workpiece support surface 172 during transfer into and out of the plasma processing chamber 100 by a robot (not shown). The substrate lift 130 may include lift pins 109 aligned with a platform 108 connected to a shaft 111. The substrate support assembly 170 may include through holes (not shown) to receive the lift pins 109 therethrough when the lift pins 109 are in the elevated position, for example when supporting the workpiece 101. The substrate lift 130 is coupled to a second lift mechanism 132 for extending the lift pins 109 through the through holes to support the workpiece 101 in a position above the workpiece support surface 172 to facilitate robotic transfer of the workpiece 101. The substrate lift 130 additionally lowers the lift pins 109 below the workpiece support surface 172 so as to place the workpiece 101 on the workpiece support surface 172.

The electrostatic chuck 122 includes a puck 150. The puck 150 may include heating elements. The temperature of the puck 150, the cooling plate 151, and/or other components of the electrostatic chuck 122 may be monitored using one or more temperature sensors (not shown), such as thermocouples and the like, coupled to one or more temperature monitors. In one example, the puck 150 is coupled to at least one thermocouple for temperature monitoring.

The puck 150 supports and chucks, i.e., applies a clamping force (Fc) to, the workpiece 101. The puck 150 may include an electrically insulative puck base 162 having electrodes 134 embedded therein for generating the clamping force (Fc). The electrodes 134 are electrically connected to a chucking power source 140, such as a DC power supply. The electrodes 134 supply the clamping force (Fc) for chucking the workpiece 101 to the workpiece support surface 172 of the puck 150. The electrodes 134 may be made of any suitable electrically conductive material, such as a metal or metal alloy. Power to the electrodes 134 may be controlled by a control system 194 coupled to the chucking power source 140. In one example, the puck 150 includes one electrode 134 for chucking the workpiece 101. The electrode 134 may be a thin disk or wire disposed within the puck base 162. In another example, the puck 150 includes two or more electrodes 134 for chucking the workpiece 101. The electrodes 134 may each be thin semicircular or "D" shaped plates which may operate independently from each other. However, the one or more electrodes 134 may have any suitable shape, which may include rings, wedges, strips, and so on.

Mesas 168 and recess 164 are disposed on the workpiece support surface 172 of the puck base 162. The workpiece support surface 172 may additionally contain one or more of grooves and channels or other geometries. The workpiece 101 may be supported on the mesas 168 and elevated above the recesses 164. The recess 164 may be in fluid communication with a gas supply 141 to provide a fluid, such as helium, argon or other suitable backside gas, between the mesas 168. The backside gas may be delivered from the gas supply 141 to the recess 164 through one or more backside gas delivery holes 198 formed in the puck 150. The backside gas may flow between the workpiece 101 and the puck 150 in order to help regulate the rate of heat transfer between the puck 150 and the workpiece 101. In one example, the backside gas may comprise an inert gas, such as argon. The gas supply may deliver about 10 torr or more of backside gas pressure force (Shown as $F_p$ in FIG. 5) such as about 4 torr or more. The backside gas exerts the pressure force $F_p$ on the workpiece 101 and is discussed in detail later below.

The sensor assembly 190 may be disposed in a through hole formed in the puck 150, such as the backside gas delivery hole 198 or other suitable through hole, or in a hollow of a lift pin. The sensor assembly 190 may be porous and allow fluid, such as the backside gas, to flow therethrough. For example, the sensor assembly 190 may have passages that permit fluid to pass through the sensor assembly 190. In other embodiments, the sensor assembly 190 may be mounted in the recess 164 or other suitable location.

The sensor assembly 190 may be in communication with the control system 194. The sensor assembly 190 measures the deflection of the workpiece 101 on the workpiece support surface 172. The controller 192 determines the clamping force Fc applied to the workpiece 101 based on the deflection measured by the sensor assembly 190. In this manner, the controller 192 may adjust the clamping force Fc by adjusting the clamping voltage Vc provided to the electrode 134 by the chucking power source 140 so as to maintain a desired clamping force Fc. By maintaining a desired clamping force Fc through real-time monitoring of the actual clamping force (via the sensor assembly 190) and real-time adjustment of the power provided to the electrodes 134, damage to the workpiece 101 from the electrostatic chuck 122 can be reduces compared to conventional chucking techniques.

Advantageously, the operating parameters for puck 150 may be controlled with a feedback loop relying on the data provided by the sensor assembly 190. The measurement of deflection by the sensor assembly 190 can be extended to calculate real-time forces on the workpiece 101 for minimizing the chucking force exerted on the workpiece 101 for reducing defects and particle generation.

Figure 2:
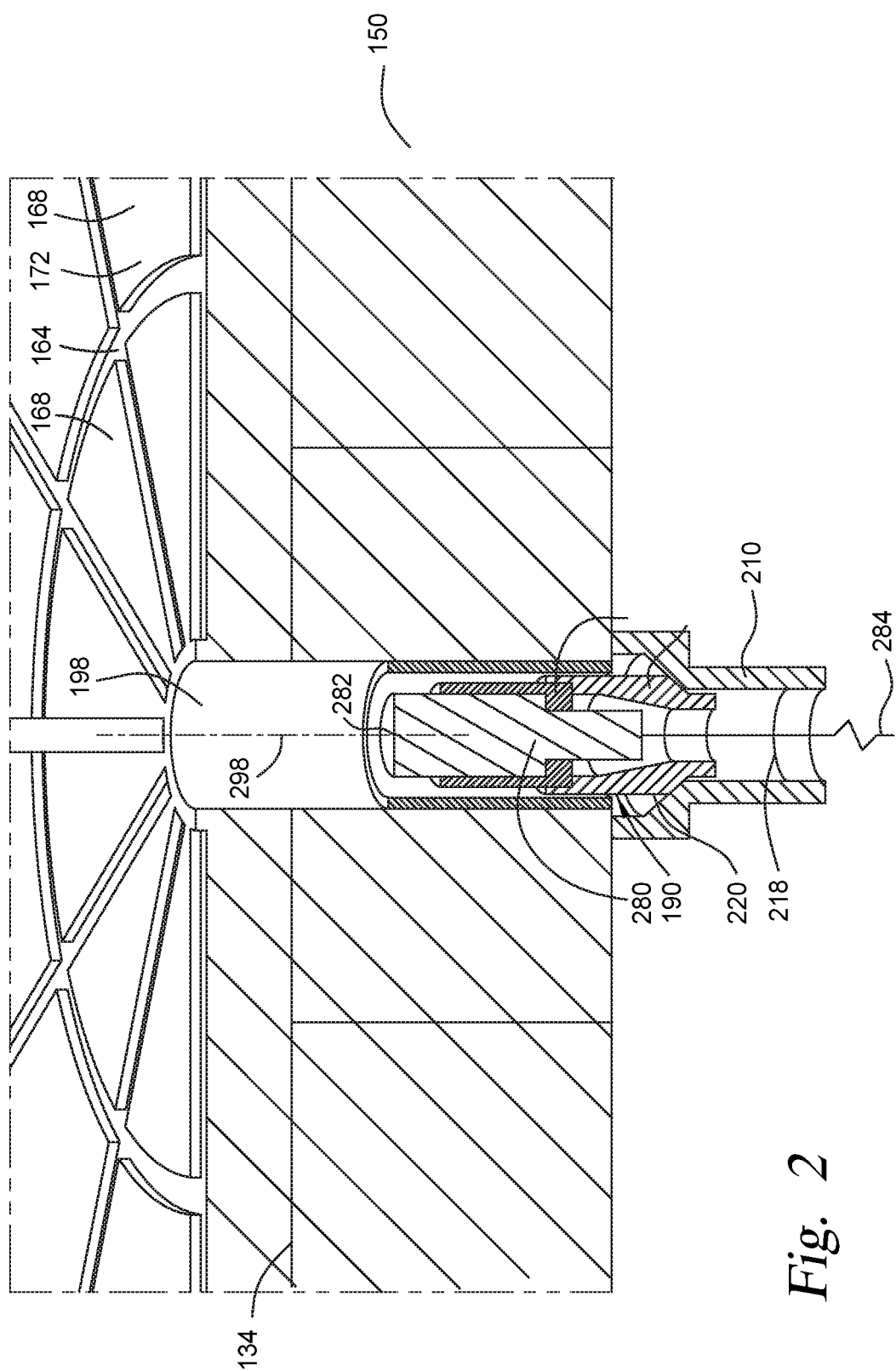
FIG. 2 is a partial cross-sectional isometric view of the substrate support having a sensor assembly mounted in a backside gas through hole.

FIG. 2 is a partial cross-sectional view of the electrostatic chuck 122 shown in FIG. 1 having the sensor assembly 190 mounted in the backside gas delivery hole 198. It should be appreciated by one skilled in the art that the sensor assembly 190 may be mounted in a hole or depression in the electrostatic chuck 122. In one or more scenarios, the electrostatic chuck 122 has a plurality of sensor assemblies 190 for detecting workpiece deflection, and thereby forces, on the workpiece. Further description of the sensor assembly 190 will be with the sensor assembly 190 being placed in one of the backside gas deliver holes 198. The shape of the hole in which the sensor assembly is mounted in the puck 150 is not limited to circular holes. The hole can be laser drilled, Electrical discharge machining (EDM), or formed in any other suitable manner.

Figure 3:
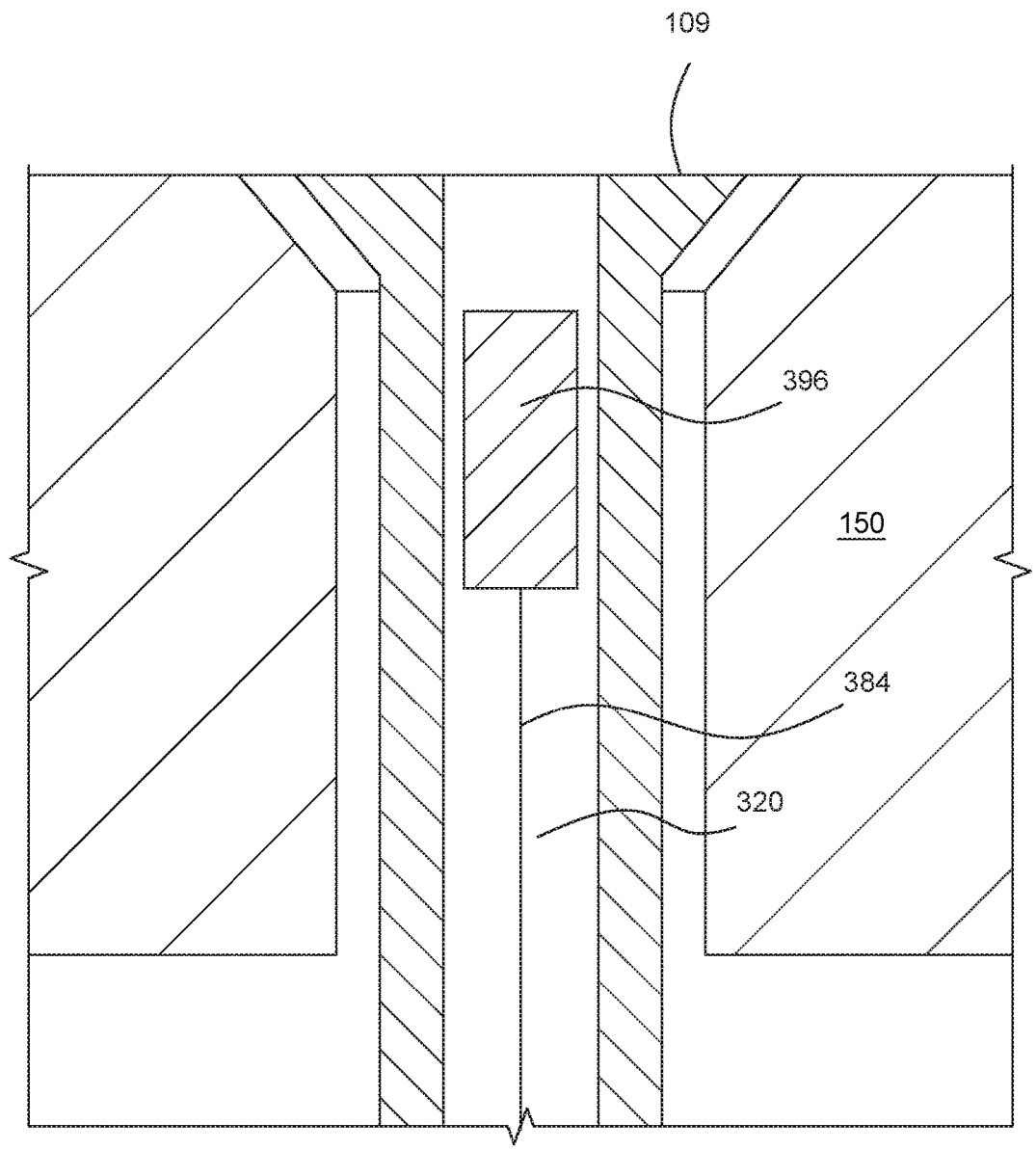
FIG. 3 is a partial cross-sectional perspective view of the substrate support having a sensor assembly mounted in a lift pin.

A backside gas passage 218 may include the backside gas delivery hole 198 and a transition conduit 210 connected thereto for providing a backside gas to the workpiece support surface 172 of the puck 150. In embodiments wherein the sensor assembly 190 is disposed in the backside gas delivery hole 198 and hardwired to the control system 194, communication connections 284 between the sensor assembly 190 and the control system 194 may traverse at least partially through the backside gas passage 218. In embodiments wherein the sensor assembly 396 is disposed in the hollow 320 of the lift pin and hardwired to the control system 194, as shown in FIG. 3, a communication connection 284 between the sensor assembly 396 and the control system 194 may traverse at least partially through the lift pin hole in the electrostatic chuck 122. In yet other embodiments where the sensor assembly is disposed in a hole or depression in the workpiece support surface 172 of the electrostatic chuck 122, the communication connection between the communication connections 284 between the sensor assembly 190 and the control system 194 may be wireless or hardwired through the substrate support assembly 170.

The sensor assembly 190 includes a sensor 280 and a sensor housing 220. The sensor 280 may be a fiber optic based sensors, such as a Fabry-Pérot sensor (FPS), or interferometer, or other sensor suitable for measuring small deflections. In one embodiment, the sensor 280 is an FPS. The sensor 280 communicates with the control system 194. In one embodiment, the sensor 280 may have communication connections 284 hardwired to the controller 192 in the control system 194. In another embodiment, the sensor assembly 190 may communicate wirelessly with the control system 194. The sensor 280 may measure a metric indicative of a distance to the workpiece (not shown) disposed on the puck 150 and provide the metric to the control system 194 in real-time for analysis by the control system 194 or other suitable device.

The sensor 280 may have a sensor head 282. The sensor head 282 may emit and receive signals for making distance measurements. The sensor 280 may be precision mounted in the puck 150 such that a distance between the sensor head 282 and any object, such as a workpiece (not shown), can be measured in real-time to determine relative displacement with nanometer accuracy. A vertical line 298 is provided which is perpendicular to the workpiece support surface 172. The vertical line 298 is merely illustrative and does not necessarily reside in the backside gas delivery hole 198 or other holes in the puck 150. The sensor 280 may be precisely mounted such that the sensor housing 220 holds the sensor head 282 aligned within +/−3 degrees of the vertical line 298, or in other words, +/−3 degrees from a perpendicular of the workpiece support surface 172. The distance of the sensor head 282 can be precisely adjusted from about less than 5 mm from the top of the mesas 168 to about 300 mm from the top of the mesas 168 by adjusting the position of the sensor housing 220 within the puck 150.

The sensor 280 may include a radiation emitter to emit radiation and a radiation detector to measure the portion of the radiation reflected by the workpiece 101. The radiation, or signal, may be, for example, electromagnetic radiation having a wavelength between about 600 nanometers and about 1700 nanometers. The radiation detector in the sensor 280 measures the return path for the radiation signal emitted. Thus, the angle and location of the sensor 280 may affect the measurement. The sensor housing 220 holds the sensor 280 in a precise location and orientation for facilitating accurate measurements. The sensor housing 220 may provide self-alignment of the sensor 280. Advantageously, the sensor head 282 can be precisely adjusted upward toward or downward away from the workpiece support surface 172 from about less than 5 mm to about 30 mm from the top of the workpiece support surface 172.

Figure 4:
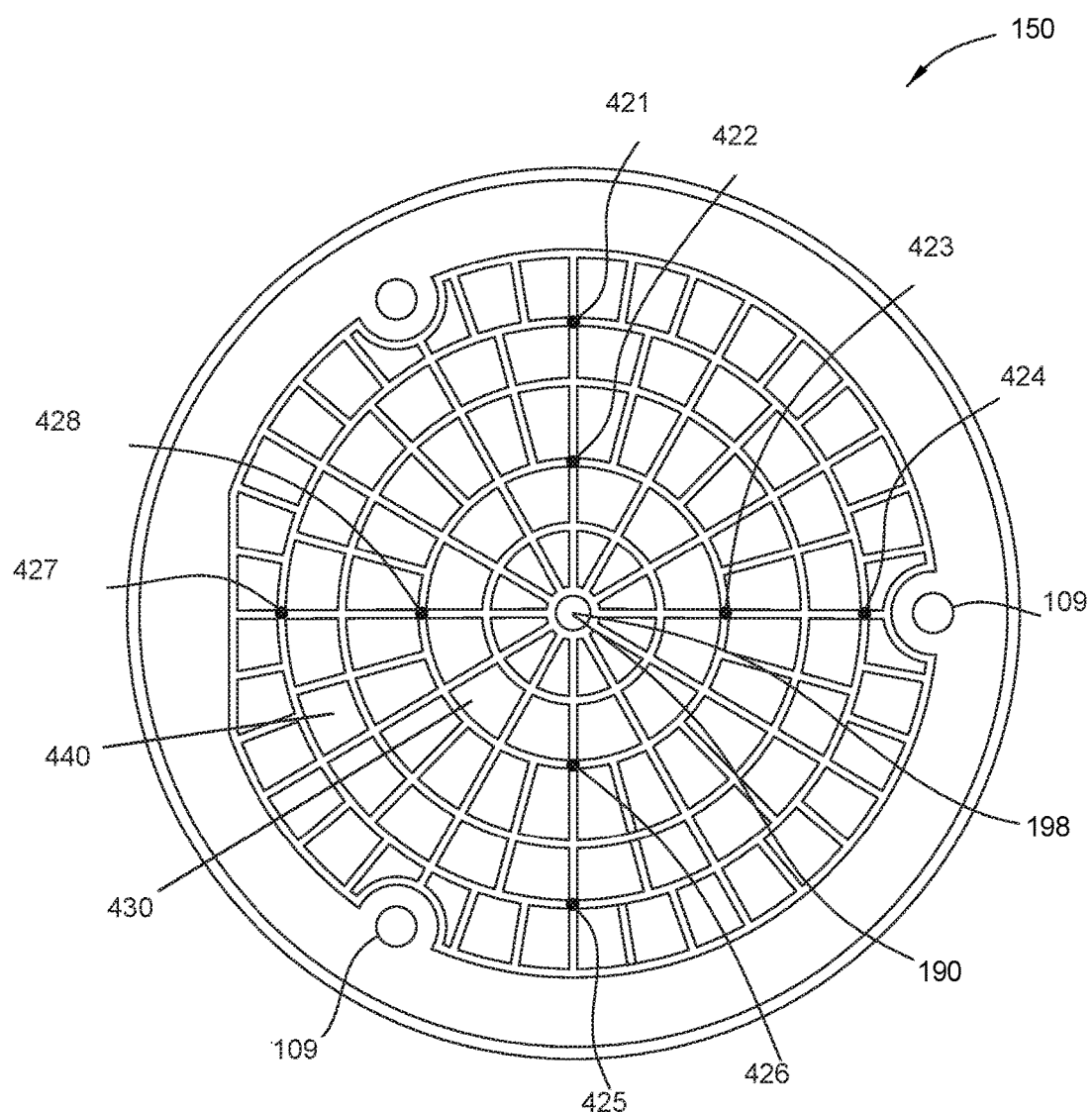
FIG. 4 are top plan views of the substrate support illustrating various locations for the sensor assembly.

FIG. 4 is top plan view for the substrate supports, such as electrostatic chuck 122, illustrating various locations for the sensor assembly 190. As discussed above, the sensor assembly 190 may be located in existing holes provided in the electrostatic chuck 122, such as the backside gas delivery hole 198, in a hollow of the lift pins 109, or holes formed in the electrostatic chuck 122. The location of the sensor assembly 190 may be determined based on existing configurations for the puck 150 of the electrostatic chuck 122. One or more sensor assemblies 421-428, 190 may be located across the workpiece support surface 172 of the puck 150 having the backside gas. The sensor assemblies 421-428, 190 may be placed in concentric rows and/or regions of the puck 150 corresponding to the arrangement of the chucking electrodes. For example, the electrostatic chuck 122 may have a plurality of concentrically arranged independent chucking electrodes. The sensor assemblies 421-428, may be arranged in an inner ring group 430 and an outer ring group 440. The sensor assemblies 421-428 may detect small variations in the localized chucking force along the puck 150. In some embodiments, the multiple sensor assemblies 421-428 may additionally include the sensor assembly 190 in a central location. Advantageously, this arrangement of the sensor assemblies 421-428 provides discrete deflection measurements over the entirety of the workpiece 101 for enhanced protection from damage or the workpiece 101 due to over-chucking.

Figure 5:
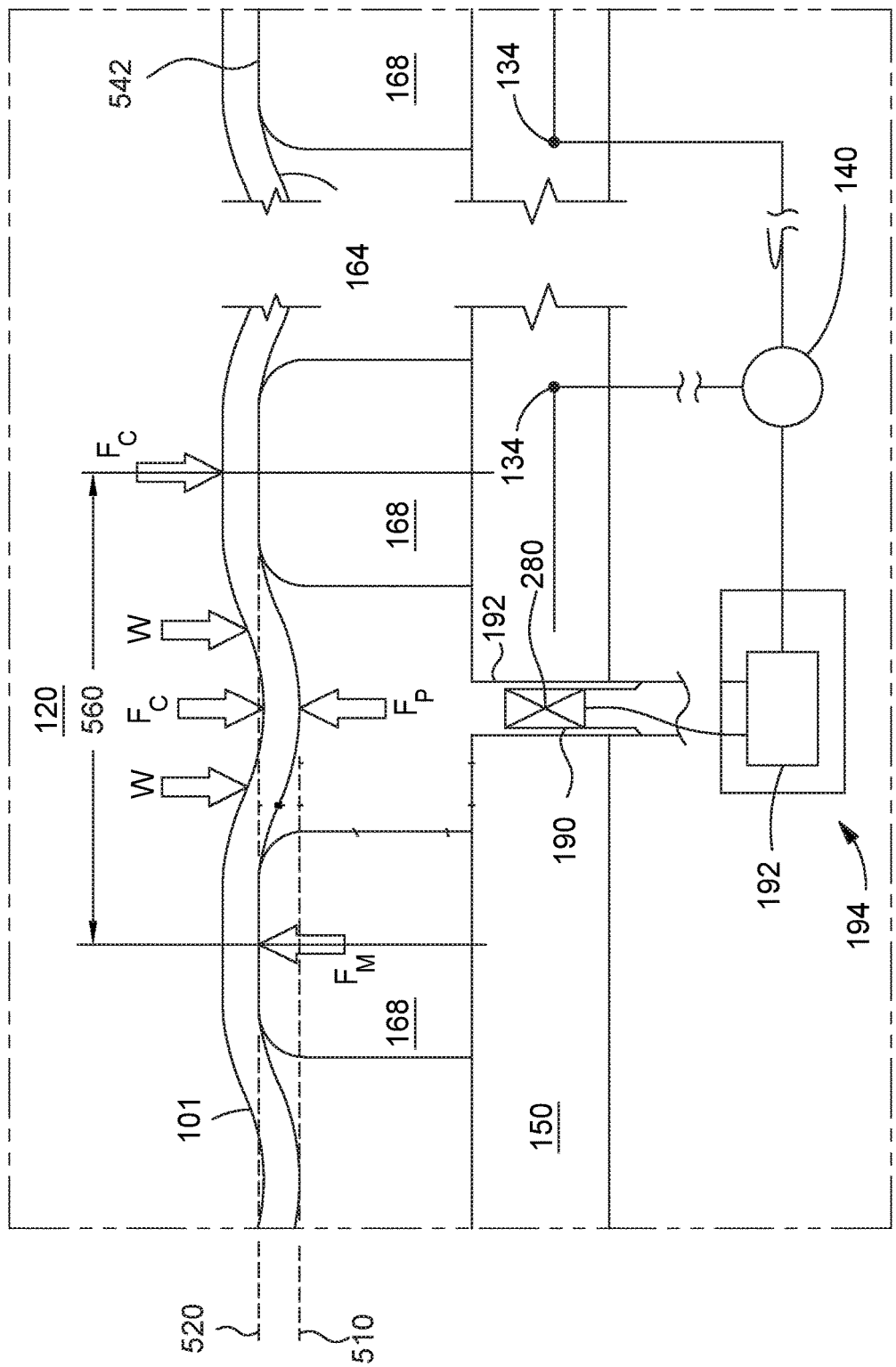
FIG. 5 is a partial cross-sectional view of the substrate support having a workpiece disposed thereon.

FIG. 5 is a partial cross-sectional view of the electrostatic chuck 122 having the workpiece 101 disposed thereon. Illustrated is the puck 150 and mesas 168 of the electrostatic chuck 122 in close proximity to the sensor assembly 190. The mesas 168 are disposed adjacent to one or more recesses 164. The mesas 168 may comprise square or rectangular blocks, cones, wedges, pyramids, posts, cylindrical mounds, or other protrusions of varying sizes, or combinations thereof that extend up from the puck 150 for supporting the workpiece 101. The workpiece 101 may be secured to the electrostatic chuck 122 with a clamping force Fc as discussed above. In one embodiment, the mesas 168 are configured to exert a minimal force on the workpiece 101 so as to not scratch or damage the backside of the workpiece 101.

Adjacent mesas 168 may have centers separated by a distance 560. In one embodiment, the distance 560 may be in a range from about 0.3 inches to about 0.5 inches. The adjacent mesas 168 may each have a height from about three (3) microns to about seven hundred (700) microns. The adjacent mesas 168 may each have a width in a range from about five hundred (500) microns to about five thousand (5000) microns. The recess 164 may have a width of from about two (2) millimeters to about ten (10) millimeters. The mesas 168 and recess 164 allow the electrostatic chuck 122 to support the workpiece 101 while additionally providing thermal management of the workpiece 101.

The mesas 168 have a top surface 542 that supports the workpiece 101. The top surface 542 generally defines a datum surface 520 on which the workpiece 101 rests when clamping forces Fc from the electrostatic chuck 122 are not applied. The datum surface 520 may serve as a reference point from which deflection of the workpiece 101 may be measured by the sensor 280. In one embodiment, as a chucking force is applied to the workpiece 101, an opposite contact pressure force is applied by the mesas 168 to the workpiece 101.

The workpiece 101 may be secured to the electrostatic chuck 122 once the clamping force Fc is applied. The clamping force Fc pulls the workpiece 101 towards the mesas 168 and together with the contact with the mesas 168 prevent movement of the workpiece 101 with respect to the electrostatic chuck 122. The clamping force Fc may not be identical or even substantially similar over the entire workpiece support surface 172 of the electrostatic chuck 122. The variability of the clamping force Fc may be attributed to variations in the puck 150 due to deposition of materials, erosion due to cleaning and etching, and from wear, among other reasons. Additionally, the clamping force Fc may be purposely differentiated across the workpiece support surface 172 such as in a zoned electrostatic chuck configuration.

The sensor 280 measures the deflection of the workpiece 101 relative to the datum surface 520. To control the clamping force $F_C$, a clamping voltage is applied to the electrodes 134 in the electrostatic chuck. The clamping voltage may be varied in response to the deflection of the workpiece 101 measured by the sensor 280. Upon applying the clamping force Fc, the workpiece 101 may be aligned with the geometric plane 510 in the recesses 164. A deflection may be indicative of the net forces substantially coincident with the clamping force Fc. The measured deflection and the clamping voltage may be adjusted until the measured deflection falls within a predefined range. For example, a predefined range of acceptable deflection may be between five hundred (500) nanometers and about two (2) microns. When the measured deflection is greater than about 2 microns, the clamping voltage may be reduced until the sensor determines in real-time that the deflection is between five hundred (500) nanometers and about two (2) microns. The deflection may be measured with sensor assembly 190 placed at two or more locations, thus enabling precise tuning of the clamping voltage to match opposing forces, such as the gas pressure and contact pressure.

The sensor 280 may measure changes in the deflection of the workpiece 101 over short time intervals. In embodiments where multiple sensors 280 monitor deflection of the workpiece 101 and the electrostatic chuck 122 is equipped with multiple clamping zones, the control system 194 may use data from individual sensors 280 located in the different clamping zones to control the clamping in that particular clamping zone for matching the opposing forces and minimizing the clamping voltage. Increase chucking voltage/force will generate more particles on the ESC and within the chamber processing environment. For example, it has been observed that for defects due to particles greater that 1 um, a chucking voltage of 800V introduced approximately 1392 embedded particles on the back-side surface of the workpiece 101. Of these embedded particles, about 21 of them where greater than 10 um in size. A chucking voltage of 1000V produced approximately 2264 embedded particles on the back-side surface of the workpiece 101. A chucking voltage of 1200V produced approximately 3546 embedded particles on the back-side surface of the workpiece 101. And a chucking voltage of 1800V produced approximately 5532 embedded particles on the front-side surface of the workpiece 101. Additionally at 1800V, the number or embedded particles greater than 10 um increased to approximately 140. Thus, the number of embedded particles is not linearly related with the voltage and each small increase in voltage generates greater and greater embedded particles. However, even more significant is the number of particles greater than 10 um which for a 2 times increase of the chucking voltage, the number of particles greater than 10 um increased by over 7 times. These back-side particle/defects can transfer onto the front-side of the workpiece 101 by the backside gas leakage or falling on the workpiece 101 during wafer handling or in the wafer cassette, i.e., FOUP. Back-side defects can also be transferred in other semi-conductor processes steps. This is significant as die and feature sizes shrink, the particles of greater size will bridge the gap between features and potentially cause the die to be unusable.

Thus, to reduce/eliminate the particles from ESC, the wafer chucking/de-chucking process minimizes the chucking force on the workpiece 101. Silicon scratches from over chucking the workpiece 101 generate particles which then can be minimized to prevent the loose particles from being introduced into the front side features of the workpiece 101 and forming defects thereon. By ramping up the forces from the introduction of the backside gas while simultaneously ramping up opposite forces from the chucking voltage, a balance of these forces on the workpiece 101 may be achieved such that the workpiece 101 may be held to the ESC without causing scratches on the backside or the introduction of particles to the front-side. In one embodiment, the He pressure is adjusted simultaneously during chucking/de-chucking steps to minimize the chucking force the on the wafer.

The electrostatic chuck 122 may be equipped with multiple clamping zones and use multiple sensor assemblies 190 having sensors 280 to monitor each clamping zone. Alternately, the electrostatic chuck 122 may have a chucking force measurement device. The chucking force measurement device may provide feedback to control the chucking voltage and ultimately the amount of force applied to the workpiece 101. It should be appreciated by one skilled in the art that any device or sensor suitable for providing or quantifying real-time forces applied to the workpiece is suitable the implementation of methodology described below with respect to FIG. 6 for reducing over-chucking of the workpiece and the defects created by over-chucking.

Figure 6:
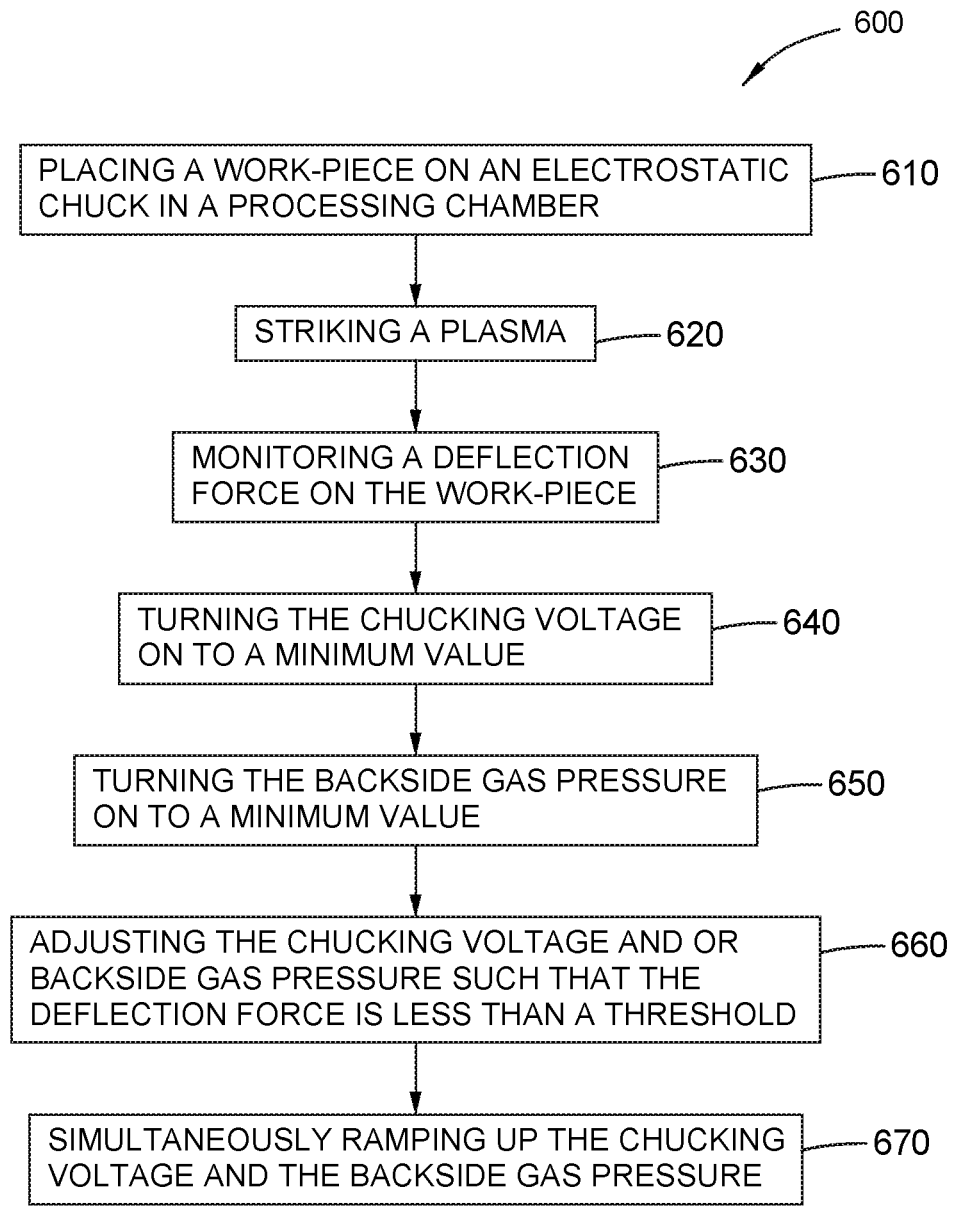
FIG. 6 is a method for minimizing the forces on the workpiece disposed on the substrate support.
Figure 7:
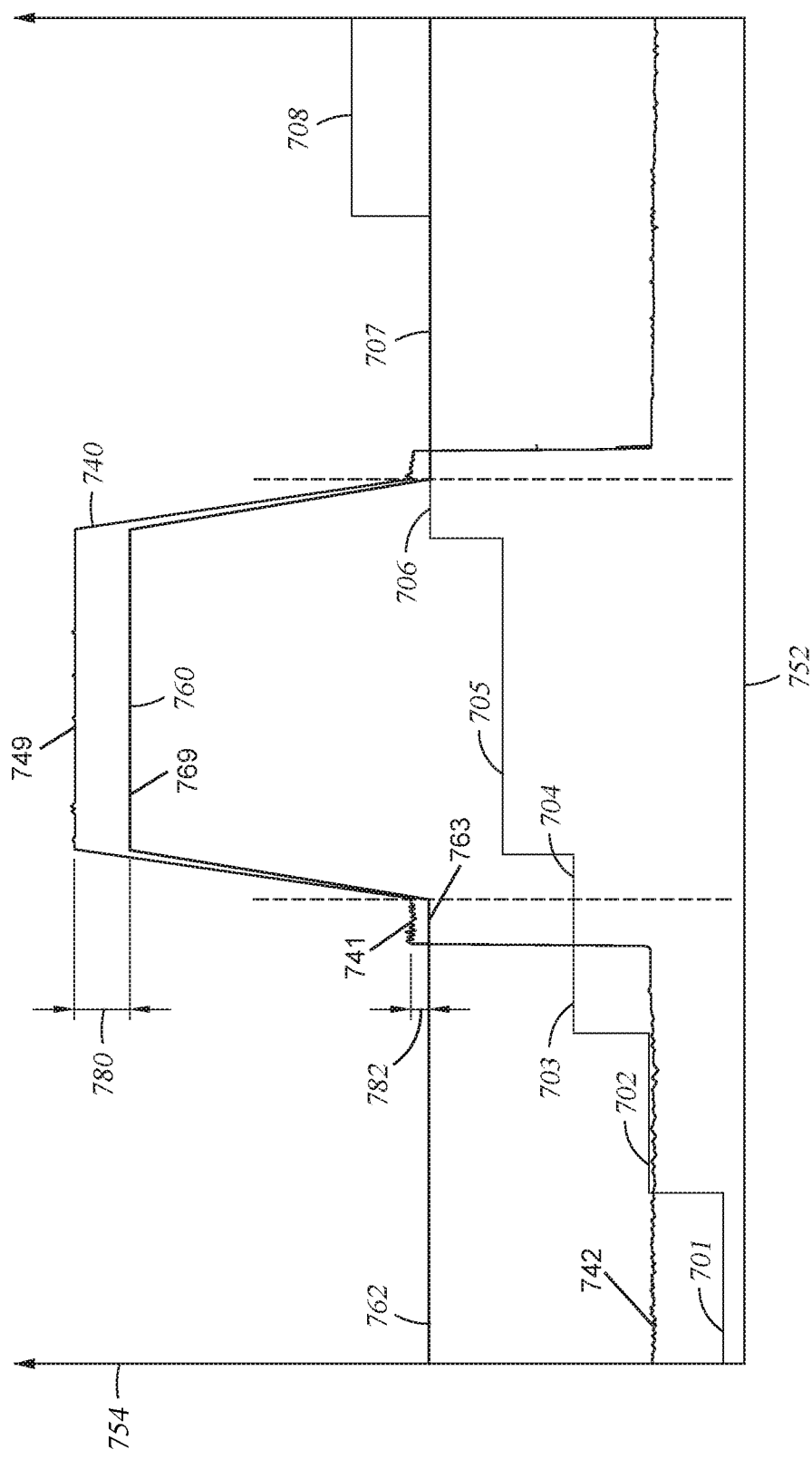
FIG. 7 is a pictorial representation for the method of FIG. 6.

FIGS. 6 and 7 will now be discussed together. FIG. 6 is a method 600 for minimizing the forces on the workpiece disposed on the substrate support. FIG. 7 is a pictorial representation for the method of FIG. 6. The workpiece may experience one or more of the electrostatic forces pushing the workpiece toward the ESC and both contact pressure along the mesas and gas pressure pushing the workpiece away from the ESC. The method 600 balances these forces at a minimum for holding the workpiece 101 to the ESC in a processing chamber.

Chucking a wafer with an electrostatic chuck is a static process (no dynamic motion of the wafer occurs). The chucking force is resisted by two opposing forces. First is the force of backside gas pressure over the backside area of the wafer exposed to this gas. The second force is the contact pressure over the area where the wafer contacts the e-chuck. FIG. 7 illustrates the respective forces on the workpiece. The y axis 754 depicts the force applied to a workpiece. The x-axis 752 depicts the timing for these forces on the workpiece.

In block 610 of the method 600, a workpiece is placed on an electrostatic chuck in a plasma processing chamber. A first time block 701 in FIG. 7 shows the chucking voltage 740 is set at a chucking minimum voltage 742 and the backside gas pressure 760 is at gas minimum pressure 762. The workpiece is transferred onto the ESC in a second time block 702. This can also achieved by ramping the chucking voltage 740 to a minimum force instead of setting a minimum chucking voltage 742. Then the backside gas pressure 760 gets turn on at minimum gas pressure 762. With this last approach the minimum force would be applied to the work piece.

In block 620 of the method 600, a plasma is struck in the processing chamber. This corresponds to a third time block 703 in FIG. 7. The plasma provides the ground for the ESC when chucking the workpiece. Here, the DC bias compensation may be disabled on the ESC when striking the plasma.

In a block 630 of the method 600, deflection forces on the workpiece are monitored. The forces are may be monitored by sensors providing stress, deflection, or other suitable information to a controller for determining the forces applied to the workpiece.

In block 640 of the method 600, the chucking voltage 740 is turned on to a minimum value 741. This can also achieved by ramping the chucking voltage 740 to a minimum force instead of setting a minimum chucking voltage 741. In block 650, the backside gas pressure 760 is turned on to the backside gas minimum pressure 763. Here the backside gas minimum pressure 763 may or may not have increased from the gas minimum pressure 762. This is because some ESCs have a minimum backside gas flowing all the time. The controller monitors and maintains deflection force 780 between the backside gas pressure 760 and the chucking voltage 740. The deflection force 780, a force differential between the backside gas pressure 760 and the chucking voltage 740, may be that which is suitable to maintain the workpiece on the ESC prior to processing yet less than a threshold value of the deflection force 780 suitable for processing.

In block 660 of the method 600, the chucking voltage 740 and or backside gas pressure 760 is adjusted such that the deflection force 780 is less than a threshold value. The deflection force 780 is the net force downwards on the workpiece. Thus, for the workpiece to be held by the ESC, the force supplied by the chucking voltage 740 is greater than the force supplied by the backside gas pressure 760. In one embodiment, the deflection force is between about 50 mTorr and about 50 Torr, such as about wafer deflection is between 10 nanometer to 5 microns.

In a block 670 of the method 600, the chucking voltage and backside gas are simultaneously ramped up. This corresponds to a fourth time block 704 in FIG. 7. A small time delay may be introduced into the ramping up of the forces between the striking of the plasma and the chucking the workpiece. In one embodiment, a delay between about 200 milliseconds and about 10 seconds is provided between the striking of the plasma and the chucking of the workpiece.

The workpiece is chucked during and the processed during the fifth time block 705 shown in FIG. 7. Here the chucking voltage 740 is now at a suitable level 749 for biasing plasma, processing the workpiece, and/or electrostatically holding the workpiece to the ESC. The backside gas pressure 760 is maintained at a high pressure 769 for counter balancing the force of the chucking voltage 740 and maintaining the deflection force 780 below a threshold.

Thus, the chucking force used to secure the workpiece is always minimized. A lower the chucking voltage reduces scratch and scratch generated particles. Method 600 chucks the workpiece at a lower force which is just sufficient to hold the workpiece on with backside gas supplied. A much lower safety margin of additional chucking force may also be applied to ensure the workpiece is firmly held by the ESC during processing. The backside cooling gas is applied and let to stabilize. Then additional force is applied only sufficient to hold the workpiece in position on the chuck during the scanning of the chuck. This minimizes the force on the wafer to reduce silicon damage caused by the electrostatic clamping of the wafer.

A closed loop control of the chucking force and backside gas pressure may be provided to minimize the chucking force which significantly reduces wafer scratch and scratch generated particles. The control system that includes one or more deflection sensor(s), or other suitable force sensors, measures and controls the clamping forces applied by the electrostatic chuck. The control system may use the deflection measured by the sensor to calculate the forces on the workpiece and adjust the clamping force applied to the workpiece by an electrostatic chuck. The control system adjusts the clamping voltage to the electrostatic chuck so that the clamping force reaches and maintains a target total clamping force applied to the workpiece. Advantageously, the clamping force may be provided to secure the silicon wafer to the electrostatic chuck and enable manufacturing operations to be performed while minimizing workpiece damage resulting from unnecessarily high clamping forces on the workpiece.

The method is extended for de-chucking the workpiece. During a sixth time block 706 the chucking voltage 740 and the backside gas pressure 760 is reduced or ramped down. Once the backside gas pressure is reduced to the gas minimum pressure 762 a small delay is provided prior to removal of the chucking voltage 740. In a seventh time block 707, the plasma is turned off and the workpiece is de-chucked. The sensor can also help in the de-chucking step providing real time feedback of when it safe to remove the workpiece or raise the lift pins. In an eighth time block 708, the workpiece is removed from the ESC and plasma processing chamber. It should be appreciated that the chucking and de-chucking operations are substantially similar but performed in reverse order.

Many modifications and other embodiments not set forth herein will come to mind to one skilled in the art to which the embodiments pertain having the benefit of the teachings presented in the foregoing descriptions and the associated drawings. Therefore, it is to be understood that the description and claims are not to be limited to the specific embodiments disclosed and that modifications and other embodiments are intended to be included within the scope of the appended claims. It is intended that the embodiments cover the modifications and variations of the embodiments provided they come within the scope of the appended claims and their equivalents. Although specific terms are employed herein, they are used in a generic and descriptive sense only and not for purposes of limitation.

While the foregoing is directed to embodiments of the present invention, other and further embodiments of the invention may be devised without departing from the basic scope thereof, and the scope thereof is determined by the claims that follow.

What is claimed is:

1. A method for minimizing chucking forces on a workpiece disposed on a electrostatic chuck within a plasma processing chamber, the method comprising:
   placing a workpiece on an electrostatic chuck in a processing chamber;
   striking a plasma within the processing chamber;
   monitoring a deflection force on the workpiece;
   applying a chucking voltage at a minimum value;
   applying a backside gas pressure at a minimum pressure;
   adjusting the chucking voltage and or backside gas pressure such that the deflection force is less than a threshold value; and
   simultaneously ramping up the chucking voltage and the backside gas pressure.

2. The method of claim 1, further comprising:
   reversing the process for de-chucking.

3. The method of claim 1, wherein a minimum value of the chucking voltage force is less than a minimum value of the backside gas pressure.

4. The method of claim 1, wherein the value of the backside gas pressure is less than the value of the chucking voltage force when the workpiece is chucked.

5. The method of claim 1, wherein the deflection force is between about 50 mTorr and about 50 Torr.

6. The method of claim 5, wherein the deflection force is about 1 Torr or less.

7. The method of claim 1, further comprising:
   Introducing a small time delay between the striking of the plasma and the chucking the workpiece.

8. The method of claim 7, wherein the small time delay is between about 200 milliseconds and about 10 seconds.

9. The method of claim 1, further comprising:
   providing a closed loop control of the chucking force and backside gas pressure; and
   minimizing the chucking force in response to the closed loop control.

10. The method of claim 1, further comprising:
    adjusting the clamping voltage to the ESC so that the clamping force reaches and maintains a target total clamping force.

11. The method of claim 1, wherein applying the chucking voltage at the minimum value, further comprises:
    selecting the chucking voltage to achieve a minimum force.

* * * * *